United States Patent [19]

Strothers, Jr.

[11] 4,041,413
[45] Aug. 9, 1977

[54] AUTOMATIC PHASE COMPENSATION CIRCUIT FOR PARALLELING POWER AMPLIFIERS IN THE MICROWAVE FREQUENCY RANGE

[76] Inventor: Claude Strothers, Jr., 30742 Tarapaca Road, Rancho Palos Verdes, Calif. 90274

[21] Appl. No.: 646,279

[22] Filed: Jan. 2, 1976

[51] Int. Cl.² ............................................. H03F 3/58
[52] U.S. Cl. ..................................... 330/43; 325/476; 330/149; 332/18
[58] Field of Search ................. 328/162; 330/43, 149, 330/30 R, 124 R; 332/18; 325/475, 476

[56] References Cited

U.S. PATENT DOCUMENTS 3,624,532  11/1971  Seidel ............................ 330/30 D X Primary Examiner—Rudolph V. Rolinec
Assistant Examiner—Lawrence J. Dahl
Attorney, Agent, or Firm—John E. Wagner

[57] ABSTRACT

A system for phase control of multiple high power microwave frequency amplifiers. A pilot frequency lower than the frequency to be amplified is used to modulate the microwave signal. The pilot frequency is detected at the output of the amplifier stage and phase compared with the original pilot frequency. Any difference is used to produce a phase correction signal applied to the amplifier. Phase modulatable traveling wave tubes are the power amplifiers. One alternate embodiment involves a steerable array employing an additional pilot frequency correction introduced into the pilot signal. In another embodiment a cross field amplifier is placed in series with a traveling wave tube amplifier in the phase correction loop.

7 Claims, 6 Drawing Figures $$\frac{\theta_o}{\theta_i} = \frac{Y_1 Y_2 Y_3}{1 + Y_1 Y_2 Y_3 Y_4 Y_5 Y_6} \quad \text{OR} \quad \approx \frac{K_1 Y_2}{1 + K_1 Y_2} \quad \text{WHEN} \quad Y_2 \ldots Y_6 \gg Y_1$$

AUTOMATIC PHASE COMPENSATION CIRCUIT FOR PARALLELING POWER AMPLIFIERS IN THE MICROWAVE FREQUENCY RANGE

BACKGROUND OF THE INVENTION

The maximizing of power output in microwave systems such as radar systems is a continuing objective. Two types of microwave amplifiers that have long been used as the output stage of high power microwave systems are the traveling wave tube and the cross field amplifier. Each have their particularly desirable characteristics and limitations. The traveling wave amplifier is a relatively broad band device operating over at least an octave and one which can simultaneously amplify, a number of frequencies in the microwave range. Typically, traveling wave tubes are operated in S and X bands. Cross field amplifiers produce high power output but are relatively narrow band devices compared with traveling wave tubes.

Parallel operation of traveling wave tubes is commonly used to multiply the output power to a single port. Performance is however limited by the variation in phase shift between different traveling wave tubes.

The cold matrix structure of a traveling wave tube is long enough to accumulate many wave lengths at any particular frequency. For example, an X-band tube may contain some 40 wave lengths. Non-uniformities due to both periodic and aperiodic mismatches along the helix perturb this characteristic to add minor "cold" differences due to helix length. Thus, the variation in electrical length is in the order of ±10° for controlled production tubes. Phase shifts caused by power supply voltage changes range from 0.5° per volt to 2.5° per volt. Phase shifts caused by changes in input power level are in the order of 4° to 5°/db.

A second but similar application of traveling wave tubes is to drive individual elements of an antenna array. Adoption of traveling wave tubes for use in such phased arrays depends on inclusion of suitable auxiliary circuits to equalize the phase shifts from tube to tube. Typical circuits for such phase equalization employ the output of one traveling wave tube to phase control the next after a phase comparison. Numerous researchers have studied the problems of parallel high power traveling wave tube operation and yet to arrive at a satisfactory solution.

BRIEF DESCRIPTION OF THE INVENTION

One of the objects of this invention is to provide maximum in-phase power output from parallel connected power amplifier stages in the microwave frequency range. It is a further object that the power output is maximized over a broad frequency range of at least an octave. A further object of the invention is to allow phase control between a number of parallel connected power amplifiers for use, for example, in television transmission where phase control of color signals is critical, or in supply power to phased antenna arrays which are electronically steered.

As a result of this invention, it is possible to achieve the above objectives and also provide improved performance of particular types of microwave transmitters which have been subject to power output limitations or unwanted effects due to phase deviation between parallel connected amplifiers. An example: when this invention is applied to the radio frequency transmitters used in wide band chirp radar systems, the linearity of the output frequency chirp characteristic is improved, greatly reducing side lobe response. In another example, the use of this invention allows a traveling wave amplifier and a cross field amplifier to be cascaded with a common control loop.

These are all achieved in accordance with this invention employing a number (n) of power amplifiers, each having their input connected to a common signal source and their output either connected in parallel to a common utilization device such as a single radar antenna or alternatively to individual elements of an antenna array. The output of each individual power amplifier is sampled and the sampled RF signals are each introduced into respective phase control networks for each power amplifier. The phase control network is furnished with a reference signal from a local oscillator operating at a low frequency compared to the microwave frequency to be amplified. The output of the reference oscillator is also applied as a phase modulation to the input of the microwave power amplifier. The modulation frequency content of the RF signal as sampled is extracted in a mixer or suitable demodulator. A phase comparison is made between the reference source and the detected modulation frequency at the output of the power amplifier. The DC error signal representative of phase error at the lower modulating frequency through the power amplifier is introduced into the power amplifier as a phase error correction. Each stage has its individual phase control circuit and each may have an individual reference oscillator or may use a common oscillator.

In an alternate embodiment, the power amplifier comprises a traveling wave tube which is controlled with the phase error signal and a cross field amplifier in series. The sampled output including the modulation signal is taken at the output of the cross field amplifier but all control is applied to the traveling wave tube amplifier.

In the case of the application of this invention to a steerable phased antenna array, each phase control circuit includes an input signal source supplying a phase deviation signal whereby different phase deviation signals may be applied to individual power amplifers and thus steer the antenna beam. All steering is done at the input to the power amplifier stage rather than at the output.

BRIEF DESCRIPTION OF THE DRAWINGS

This invention may be more clearly understood by reference to the following detailed description and the drawings in which.

DETAILED DESCRIPTION OF THE INVENTION

Figure 1:
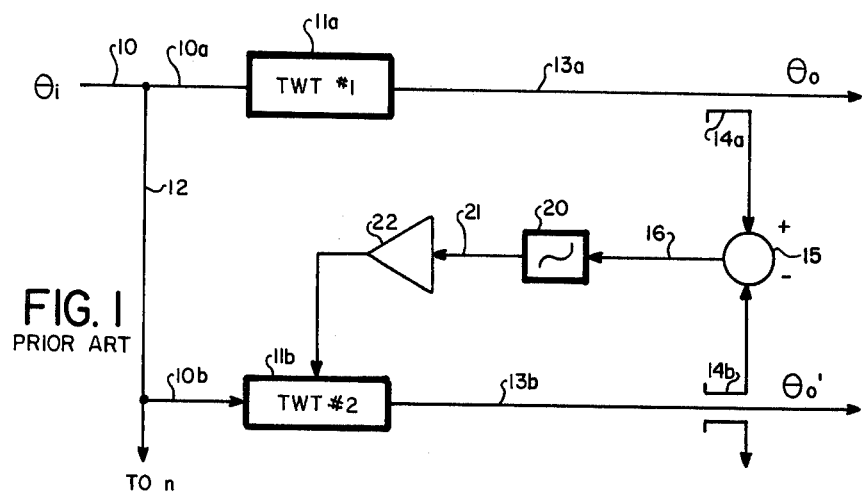
FIG. 1 is a block diagram of a tyical prior art feedback phase stabilization system.

Referring now to FIG. 1, a typical prior art parallel operation power amplifier circuit employing traveling wave tubes is disclosed therein designed to amplify a signal $\theta_i$ appearing on lead 10 and introduced in parallel by leads 10a, 10b – 10n to a number of traveling wave tubes 11a, 11b – 11n. The inputs are all connected by a common bus 12. The output of each traveling wave tube 11a – 11n appears on its respective output lead 13a – 13n. This output is identified as $\theta_o'$. Theoretically, at least, the outputs will all be in phase. Phase sychronization in each of the traveling wave tubes 11a through 11n is achieved employing a feedback system in which the output on lead 13a is sampled by sampling coupler 14a while the output on lead 13a is sampled by similar coupler 14b. The sampled RF signals are combined in differential devices such as a mixer of differential amplifier 15 and the difference or error signal appearing on lead 16 is applied to a detector 20 which produces a DC output on lead 21 proportional to the phase difference between the two signal samples taken by the sampling couplers 14a and 14b. This phase error signal is amplified in the DC amplifier 22 and applied as a helix bias signal to traveling wave tube 11b. This is, in effect, a feedback control circuit designed to lock the phase of the traveling wave tube 11b to that of traveling wave tube 11a.

The phase control employing the prior art system of FIG. 1 has not proved effective because it is affected by variations in power output of the controlled tube 11b and, more important, the dynamic range of phase control is limited to ±90°. That is, if the combined phase shift from all causes in the traveling wave tubes 11a and 11b of FIG. 1 exceed 90° from the established operating point, the regulating circuit becomes unstable. Given the two limitations of phase error correction limits and power level sensitivity of the control circuit, the phase compensation system of FIG . 1 has not proved adequate.

Figure 2:
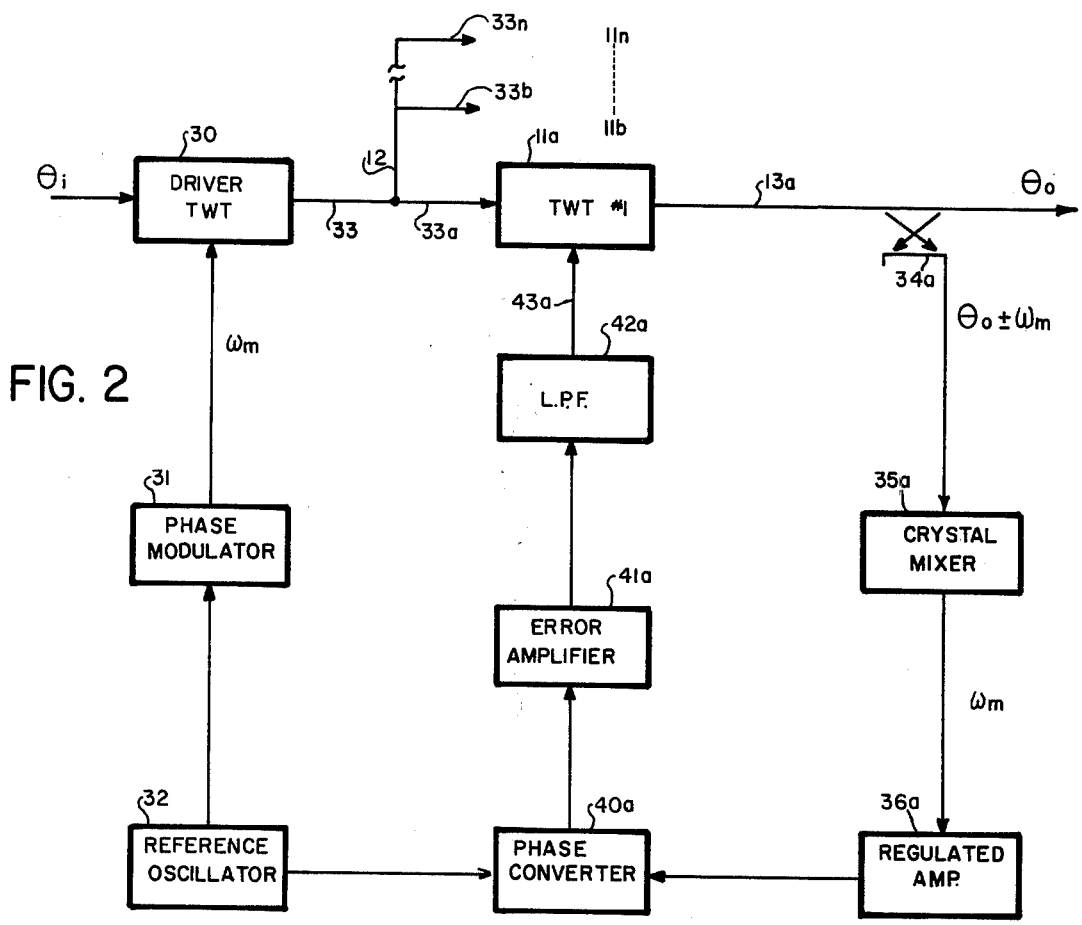
FIG. 2 is a block diagram of an embodiment of this invention.

The problems incurred in the prior art have been solved employing my invention appearing in FIG. 2. In this case, similar elements to those of FIG. 1 are given similar designations.

Now referring to FIG. 2, the input signal $\theta_i$ is applied first to a phase modulated driver traveling wave tube amplifier 30. The driver traveling wave 30 is modulated by phase modulator 31 driven by a reference oscillator 32. The output of the driver traveling wave tube 30 is the microwave input signal plus a lower frequency lower level modulation thereon. This is introduced by a lead 33 and lead 33a into the first traveling wave tube 11a and via bus 12 to individual leads 33b and 33n to other parallel connected traveling wave tubes 11b through 11n which are unshown in the figure but identical to 11a. The output of traveling wave tube 11a on lead 13a is the output signal $\theta_o$ plus an insignificant level of the modulation frequency from the phase control circuitry. The output on lead 13a is sampled in sampling coupler 34 and introduced into a crystal mixer 35 which extracts the modulation frequency $\omega_m$ which is in turn amplified in regulated amplifier 36 and introduced into phase converter or discriminator 40. The output of the reference oscillator 32 is also introduced into the phase converter or discriminator 40 which produces a DC error signal proportional to the phase error at the modulation frequency between the input to traveling wave tube 11a and its output. The DC error signal from the phase converter 40 is amplified in error amplifier 41 and high frequency components removed in low pass filter 42. The filter 42 will have a cutoff frequency related to the response characteristics desired. The error signal appearing on lead 43 is applied to the helix of the traveling wave tube 11a. Each of the traveling wave tubes 11b through 11n have similar independent loops although they may all employ the common reference oscillator and phase modulator. In the circuit of FIG. 2, each of the additional stages 11b through 11n do employ driver amplifier 30, reference oscillator 32 and phase modulator 31. Each control loop is separate and there is no cascading of control signals as in the case of FIG. 1.

In summary, the circuit of my invention involves phase controls through the use of a control signal in the lower frequency, e.g. 100 to 500 MHz range. This control signal is used to modulate a traveling wave tube driver stage and and an automatic phase control loop operating at the control modulation frequency, and is used to control the phase of the output traveling wave tube. The traveling wave tube driver is common to all output traveling wave tubes an each has its output controlled by a separate phase control feedback loop. The level of modulation is so low to prevent objectional side band components in the radiated signal.

The control modulation prevents ambiguous phase control since the total phase shift of the control signal through the traveling wave tube will be in the order of one wave length at the control frequency. On the other hand, since the phase shift variation through a traveling wave tube at the microwave frequency may exceed a wave length, the total phase error correction required by the controlled loop will amount to hundereds of degrees at the microwave frequency.

As was shown and described above in connection with FIG. 2 the control modulation signal is recovered from the microwave carrier by the crystal mixer 35. Then after amplification of the detected modulation signals, the phase converter 40 acts as a phase discriminator to obtain the phase error signal which is used to modulate the helix of the traveling wave tube 11a.

Within the feedback loop, the instantaneous frequency, $\omega_i$ is given by:

$$\omega_i = \omega_c + \Delta\omega\cos\omega_m t \tag{1}$$

where:
$\omega_c$ = carrier frequency
$\Delta\omega$ = frequency deviation due to modulation $\omega_m$ = modulating frequency.

The phasor $\theta(t)$ is obtained by integrating (1)

$$\theta(t) = \int \omega_i dt = \omega_c t + \frac{\Delta\omega}{\omega m} \sin \omega_m t + \theta_k. \tag{2}$$

Figure 3:
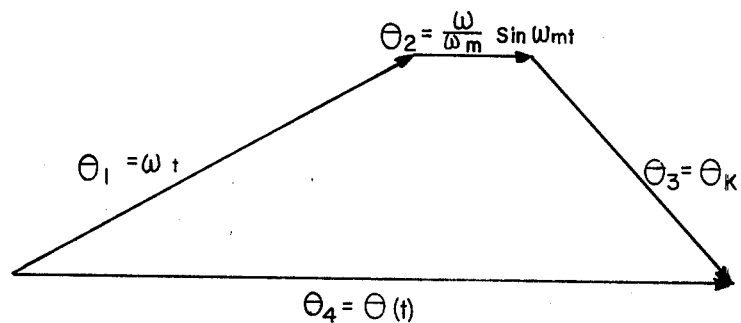
FIG. 3 is a vector diagram representing the phase response characteristics of a traveling wave amplifier.

Clearly, for a given $\theta(t)$, fixed, and $\omega_c t$ fixed, $\theta_k$, which represents traveling wave tube phase drift, will directly be influenced by changes in modulation $\Delta\omega$, and vice versa. FIG. 3 shows the vector representation with $\theta_k$ composed of the summation of $\theta_1$, $\theta_2$ and $\theta_4$ $\theta_k$ is controlled by the phase response characteristics of the tube respectively length, cathode voltage, amplitude sensitivity and helix phase sensitivity of traveling wave tube. The helix response is used, via the feedback loop, to correct the combined phase error of the first three factors.

Figure 4:
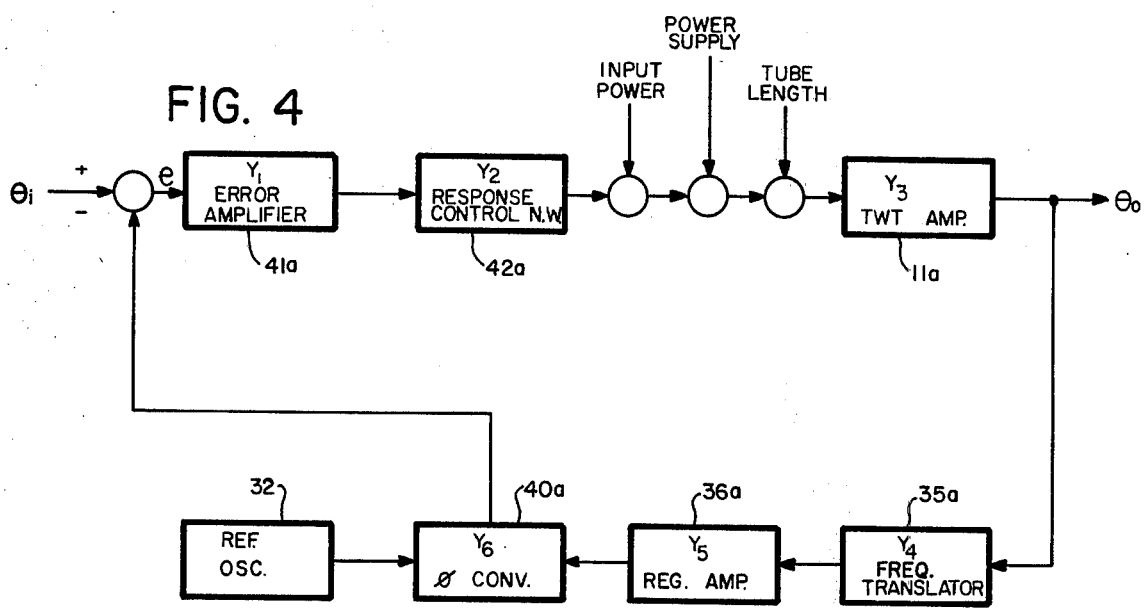
FIG. 4 is servo-equivalent block diagram of this invention.

In setting up the traveling wave tube loops operation, it will be helpful to use automatic control network methodology. FIG. 4 shows the servo-equivalent of FIG. 2 and includes the extraneous phase "noise" inputs. The loop transfer response is given by:

$$\frac{\theta_o}{\theta_i} = \frac{Y_1 Y_2 Y_3}{1 + Y_1 Y_2 Y_3 Y_4 Y_5 Y_6} \quad (3)$$

In a typical system with agile pulse-to-pulse frequency response over an octave range, phase output of an array of traveling wave tubes would be equalized on an intra-pulse basis, within several nano-seconds. This limit is established at the range of 10 to 100 nano-seconds by feedback response attainable within state-of-art stability limits.

If, as typical, an unstabilized traveling wave tube output phase drift of ± 100° is assumed, an open loop gain of 100 would provide correction to ± 1.0°. The relation between loop cut of frequency and time for loop stabilization with an open loop gain of 100 is:

| Loop roll-off frequency (3 db) KHz | 50 | 100 | 250 | 500 |
|---|---|---|---|---|
| Phase stabilization Sec $\times\ 10^{-9}$ | 100 | 50 | 20 | 10 |

The minimum level of the radiated control signal is established by the bandwidth of the IF amplifier. Assume a 1,000 watt traveling wave tube is being used in each channel. Whether the tube is pulsed or operated in a CW mode, is not important as the operation of this automatic phase control (APC) is the same in either case. A −60 db directional coupler is used to couple one milliwatt of traveling wave tube output to the crystal mixer for a local oscillator signal. In the mixer, the pilot modulation sidebands heterodyne with the microwave carrier and form a product which is amplified in the IF amplifier. The threshold levels for the pilot feedback signal is determined by the conventional KTB limit:

$$S_{min} = KTBF\ (S/N) \quad (4)$$

where
  K = Boltzman's constant
  T = temperature in degrees Kelvin
  B = bandwidth in Hz
  F = noise figure of IF amplifier
  S/N = minimum signal-to-noise ratio allowable Assume that the amplifier noise figure and the minimum S/N are each 10 db. The minimum signal desired out of the mixer is then $4 \times 10^{-11}$ watt. Assume a mixer loss of 10 db, and considering the 60 db directional coupler, the radiated pilot signal will be down 74 db from the primary signal transmitted.

Figure 5:
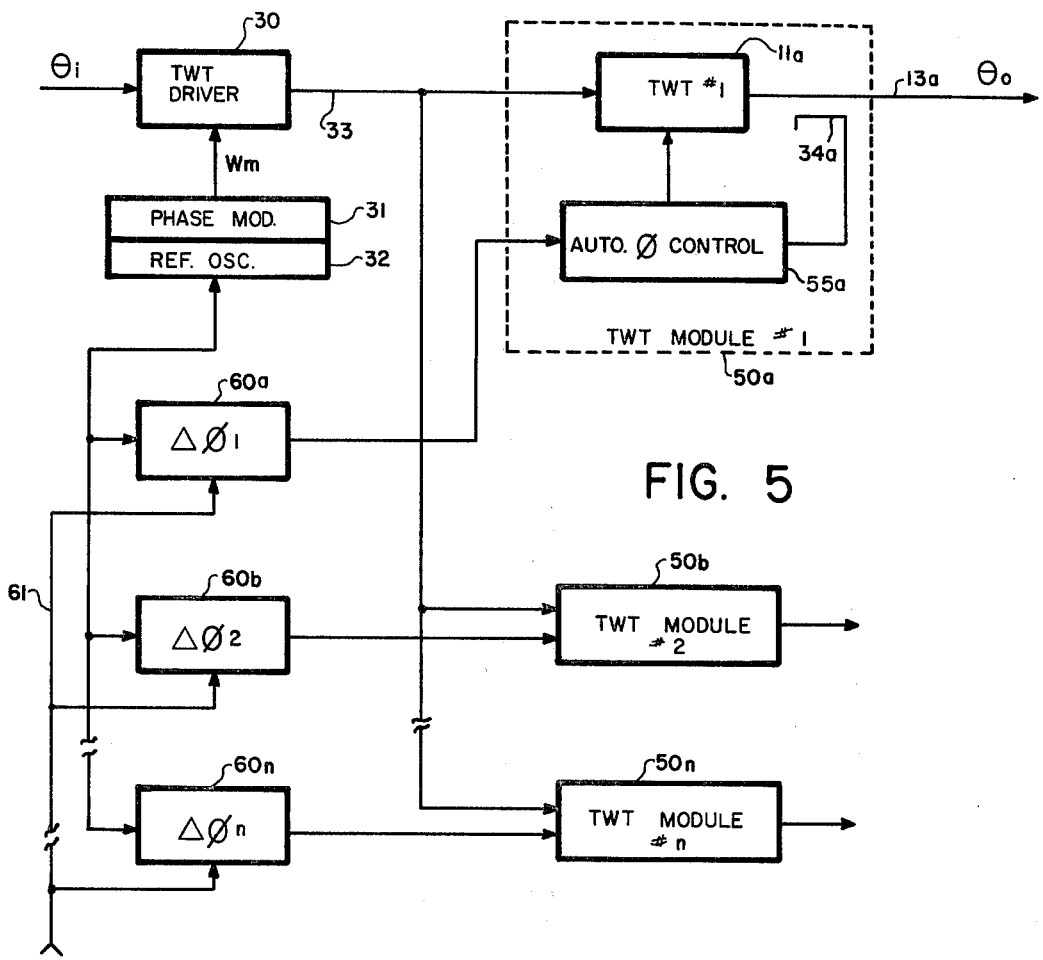
FIG. 5 is a block diagram illustrating this invention applied to automatic beam steering arrays.

The operation of a typical phased array employing my invention is shown in FIG. 5. In this figure, again, identical elements are shown with the same designation as in FIG. 2. Now referring to FIG. 5, the input signal $\theta_i$ is introduced into a driver traveling wave tube 30 which via lead 33 feeds a plurality of traveling wave tube modules 50a through 50n. Each of these modules includes a power amplifier, namely a traveling wave tube, 11a–n, and an automatic phase control circuit 55 corresponding to the elements crystal mixer 35, regulated amplifier 36, phase converter 40, error amplifier 41, and low pass filter 42 of FIG. 2. Again, the output signal on lead 13a is sampled in directional coupler 34 and introduced into the automatic phase control circuit 55.

In the embodiment of FIG. 5, the reference oscillator 32 and phase modulator 31 again modulate the traveling wave tube driver 30 with the modulation frequency. The reference frequency is introduced into phase control circuits 60a through 60n. These phase control circuits 60a through 60n are preferably varactor diode phase shifters.

Note that phase shifts in the pilot reference signal provide a convenient way to shift in the pilot reference signal provide a convenient way to shift the reference phase in each channel for beam steering. Moreover, not that this allows beam steering at low power levels and eliminates the need for expensive, power-limited phase shifters in the ouput amplifier circuits.

Figure 6:
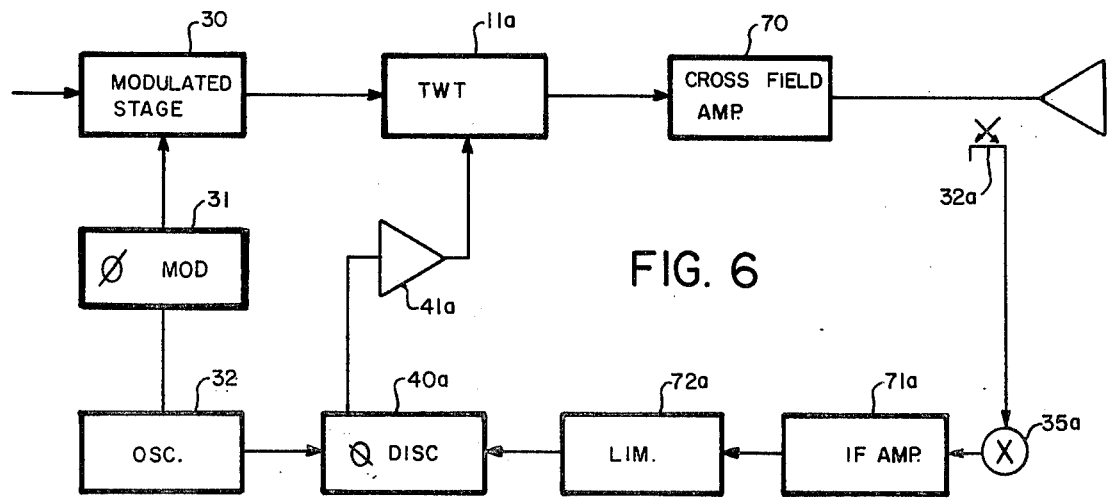
FIG. 6 is a block diagram of a traveling wave tube-cross field amplifier system incorporating this invention.

Now referring to FIG. 6, an alternate embodiment of this invention may be seen therein in which a traveling wave tube 11a operates in cooperation with a cross field amplifier 70 to provide high power output with the same high degree of phase stability present in this embodiments of FIGS. 2 and 5. In this case, the traveling wave tube modulation stage 30 is identical to the traveling wave tube driver bearing the same designation of FIGS. 2 and 5. Similarly, a reference oscillator 32 is present as well as modulator 31. The phase correction loop, again, includes a coupler 34 crystal mixer 35, and in this case, an IF amplifier 71 limiter 72 in addition to the phase converter or discriminator 40, error amplifier 41, and low pass filter 42. When so connected with the circuit of FIG. 6 operates in the same general manner as FIG. 2 only with the cross field amplifier 70 with its high gain in the phase control loop but without control inputs. Phase control is accomplished at the traveling wave tube 11a. The circuit of FIG. 6 may be used in arrays of the type shown in FIG. 5 or in parallel power amplifier embodiments of the type shown in FIG. 2.

Characteristic of each embodiment of this invention is the fact that a low frequency pilot modulation is generated, applied to the RF signal, detected, phase compared, and used to correct the phase of the carrier signal. By so doing, each of the limitations in prior feedback stabilized parallel operations circuits have been eliminated.

In carrying out this invention, the power amplifiers are preferably serrodyne phase modulated traveling wave tubes with output power in the order of 1000 watts and a power gain of approximately 1000 in the frequency range of 1000 to 20,000 MHz. The traveling wave tube driver 30 is preferably a low (1 watt) output phase modulated traveling wave tube. Traveling wave tubes of these types are generally available from sources such as the Electrom Tube Division of Litton Industries of Mountain View, Cal. Alternate traveling wave tubes for the power amplifiers 11 and driver 30 respectively are Type 767 H and 771 H of the Huges Aircraft Co, Electron Dynamics Division of Torrance, Cal.

The above described embodiments of this invention are merely descriptive of its principles and are not to be considered limiting. The scope of this invention instead shall be determined from the scope of the following claims, including their equivalents.

What is claimed is:

1. An automatic phase control microwave amplifier system employing a plurality of microwave power amplifiers;
    means applying a microwave signal to be amplified in parallel to the power amplifiers;
    a reference signal source having a lower frequency than the frequency of the microwave signal applied to the microwave power amplifiers;

means phase modulating the microwave signal to be amplified with the output of the reference signal source;

respective means coupled to the output of each microwave power amplifier for detecting the phase of the modulation frequency content of the output of the respective power amplifiers;

respective means for phase comparing the reference signal from its reference signal source and the reference signal detected at the output of its respective microwave power amplifier;

respective means developing an error signal proportional to the phase error between the reference signal and the reference signal as detected at the output of the microwave power amplifier; and means applying respective the error signals to each respective microwave power amplifier as a phase correction signal.

2. The combination in accordance with claim 1 wherein each of said power amplifiers includes a traveling wave tube amplifier and the error signal is applied to the traveling wave tube amplifier to phase modulate signals applied thereto.

3. The combination in accordance with claim 1 wherein common reference oscillator employed for all of said power amplifier phase correction circuits.

4. The combination in accordance with claim 3 wherein each of said power amplifiers includes an additional respective reference signal source for individual phase control from a common reference phase defined by said common reference oscillator.

5. The combination in accordance with claim 1 wherein said power amplifier comprises a traveling wave tube amplifier followed by a cross field amplifier with the reference signal detected at the output of the cross field amplifier and phase error correction signal applied to the traveling wave tube amplifier.

6. The combination in accordance with claim 1 wherein the phase error correction signal is applied to the helix of the traveling wave tube amplifier.

7. The combination in accordance with claim 1 including means for varying the phase of the phase correcting error signal derives from said reference signal as applied to said phase comparing means and including means for applying a plurality of phase deviation producing signals to said last means in order to introduce a plurality of controlled phase deviation into the output of said power amplifiers.

* * * * *

UNITED STATES PATENT OFFICE
CERTIFICATE OF CORRECTION

Patent No. 4,041,413     Dated August 9, 1977

Inventor(s) Claude Strother, Jr.

It is certified that error appears in the above-identified patent and that said Letters Patent are hereby corrected as shown below:

The inventor's name should read -- Claude Strother, Jr. --.

Column 1, line 15, cancel the comma following "amplify".

Column 1, line 46, after "and" insert -- have --.

Column 2, line 51, "tyical" should read -- typical --.

Column 4, line 57, there should be a period and space, indicating the beginning of a new sentence, after "$\theta^4$".

Column 5, line 20, "10-$^9$" should read -- $10^{-9}$ --.

Signed and Sealed this

Fourth Day of April 1978

[SEAL]

Attest:

RUTH C. MASON         LUTRELLE F. PARKER
*Attesting Officer*     *Acting Commissioner of Patents and Trademarks*